(12) United States Patent
Chen

(10) Patent No.: US 8,405,375 B2
(45) Date of Patent: Mar. 26, 2013

(54) INTERMITTENTLY ACTIVATED BANDGAP REFERENCE CIRCUIT

(75) Inventor: Chung-Zen Chen, Hsinchu (TW)

(73) Assignee: Elite Semiconductor Memory Technology Inc., Hsinchu (TW)

( * ) Notice: Subject to any disclaimer, the term of this patent is extended or adjusted under 35 U.S.C. 154(b) by 167 days.

(21) Appl. No.: 13/168,419

(22) Filed: Jun. 24, 2011

(65) Prior Publication Data

US 2012/0326695 A1  Dec. 27, 2012

(51) Int. Cl.
*G05F 3/16* (2006.01)
(52) U.S. Cl. ........................ 323/313; 327/539
(58) Field of Classification Search .......... 323/312–317; 327/539–543
See application file for complete search history.

(56) References Cited

U.S. PATENT DOCUMENTS

| | | | |
|---|---|---|---|
| 5,200,273 A | 4/1993 | Muraoka et al. | |
| 6,370,046 B1 * | 4/2002 | Nebrigic et al. | 363/60 |
| 6,788,131 B1 | 9/2004 | Huang | |
| 6,856,525 B2 | 2/2005 | Wallis | |
| 7,236,047 B2 | 6/2007 | Tachibana et al. | |
| 7,443,231 B2 | 10/2008 | Chang | |
| 7,633,778 B2 * | 12/2009 | Mok et al. | 363/60 |
| 7,825,639 B1 * | 11/2010 | Suzuki et al. | 320/166 |

* cited by examiner

*Primary Examiner* — Jessica Han
(74) *Attorney, Agent, or Firm* — Duane Morris LLP

(57) ABSTRACT

A circuit for providing a reference voltage includes a bandgap reference circuit, a first unity gain buffer coupled to the bandgap reference circuit, a first switch for coupling a second reference voltage node to a third reference voltage node, a first capacitor coupled to the third reference voltage node, a second switch for coupling the third reference voltage node to a fourth reference voltage node, and a second capacitor coupled to the fourth reference voltage node, wherein during operation a fourth reference voltage at the fourth reference voltage node decays when the second capacitor discharges. A control circuit provides control signals for intermittently operating the bandgap reference circuit and for controlling the switches to recharge the second capacitor after the fourth reference voltage decays a predetermined amount.

20 Claims, 9 Drawing Sheets

INTERMITTENTLY ACTIVATED BANDGAP REFERENCE CIRCUIT

FIELD OF THE INVENTION

The present invention relates to bandgap reference circuits.

BACKGROUND OF THE INVENTION

References voltages used in circuits such as memories should be stable and immune from temperature and power supply variations. A bandgap reference circuit is commonly used in memory circuits, such as dynamic random access memory (DRAM), as a reference-voltage circuit. The bandgap circuit generates a constant reference voltage that is independent of temperature and power source voltage.

The operating principle behind bandgap reference voltage generation is familiar to those in the art but is briefly described below. The bandgap reference voltage generator usually has an output voltage around 1.25 V, close to the theoretical bandgap of silicon at 0 K. The voltage difference between two unequal size diodes is used to generate a proportional to absolute temperature (PTAT) current in a first resistor. This current is used to generate a PTAT voltage in a second resistor, which is added to the voltage of a diode, in some implementations. If the ratio between the first and second resistor is chosen properly, the first order effects of the temperature dependency of the diode voltage and the PTAT voltage will be canceled out. The resulting voltage is around 1.25V. The voltage change over the operating temperature of typical integrated circuits is on the order of a few millivolts. Examples of prior art bandgap circuits that operate in this manner are provided in U.S. Pat. No. 6,788,131 to Huang and U.S. Pat. No. 5,200,273 to Mao, the entirety of which are hereby incorporated by reference herein.

In summary, the output voltage is made substantially invariant with regard to temperature by taking a weighted sum of a voltage that has a negative temperature coefficient (viz the voltage across the PN junction) and one that has a positive temperature coefficient. However, the bandgap reference voltage generator is always "on" or "enabled" in order to provide the reference voltage for the integrated circuit, thereby increasing the power consumption of the integrated circuit. These bandgap reference circuits are not appropriate for low power DRAM, which demands a low current consuming reference circuit generator.

Low power DRAM have a VDD voltage that is below 1.8V. If this VDD voltage is the power supply for the bandgap reference circuit, it cannot provide a bias independent reference voltage (Vref). That is, Vref will roll off when VDD is lower, for example, below 1.6V. The bandgap reference circuit will consume about 20 µA. In DRAM circuits there is a higher pseudo power supply voltage VH that is available, which is the power supply for the word line. This voltage can be used as the power supply for the bandgap circuit, however the bandgap circuit will consume 80 µA since the electrical current pumping efficiency is only about 25%. Pumping efficiency means the electrical current pumping efficiency. A pumping circuit will sink the power supply Idd current and generate a pumping current Ipump. The pumping efficiency is equal to Ipump/Idd.

There are two principal methods of reducing the sinking current of the bandgap reference circuit. One method is known as a the scan method. In this method, the bandgap reference circuit uses the VH supply as the power supply during the initial power-up stage. The approach uses a resistor divider with multiple switches to select the divided voltage. When the external power supply is stable (for example, when the mode register set (MRS) command is issued by the system), the switches are scanned and stop when the divided voltage is equal to the reference voltage Vref from the bandgap reference circuit. The bandgap reference circuit is then turned "off", thereby limiting its current consumption of the bandgap reference circuit. The voltage divider supplies the reference voltage Vref for the device and consumes only a few micro-amperes of current. The penalty for this approach lies in its circuit complexity, which requires a large number of comparators to compare the divided voltage with the bandgap reference voltage supplied by the bandgap reference circuit.

The other method of reducing the sinking current of the bandgap reference circuit is to provide just enough power to the bandgap reference circuit. One such approach is shown in block diagram form in FIG. 1. A charge pump circuit is used to supply the power to the bandgap circuit. Assuming that the pumping efficiency is 50% to sustain a 2V output and the bandgap circuit pumps 10 µA (Ipump), then the circuit sinks VDD 20 µA to have the 10 µA supply capability. An oscillator is used to drive the charge pump circuit and it sinks about 5 µA. The total sink current for this approach is, therefore, about 25 µA.

In a slight modification to this approach, rather than use the charge pump output from power-up to power stabilization, the bandgap circuit uses the VH pseudo power supply during the power-up stage. As noted above, the VH supply is designed in the DRAM circuit to supply the power of the word line. When MRS is issued from the controller after power supply stabilization, the power supply of the bandgap circuit is switched to the output of the high efficiency charge pump. Since VH is a higher voltage level and thus lower pumping efficiency, it is replaced after MRS is issued to save power.

Lower power reference voltage generation circuits and methods are desired.

SUMMARY OF THE INVENTION

A circuit for providing a reference voltage includes a bandgap reference circuit operable to provide a first reference voltage; a first unity gain buffer coupled to the bandgap reference circuit operable to provide a second reference voltage at a second reference voltage node from the first reference voltage; a first switch for passing the second reference voltage between the second reference voltage node and a third reference voltage node; a first capacitor coupled to the third reference voltage node; a second switch coupled between the third reference voltage node and a fourth reference voltage node; a second capacitor coupled to the fourth reference voltage node, wherein during operation a fourth reference voltage at the fourth reference voltage node decays when the second capacitor discharges; and a control circuit operable to provide control signals to intermittently activate the bandgap reference circuit, first unity gain buffer and first switch for charging the first capacitor, to disconnect the third and fourth reference voltage nodes during charging of the first capacitor and to connect the third and fourth reference voltage nodes following charging of the first capacitor, thereby increasing the fourth reference voltage following decay thereof.

The above and other features of the present invention will be better understood from the following detailed description of the preferred embodiments of the invention that is provided in connection with the accompanying drawings.

BRIEF DESCRIPTION OF THE DRAWINGS

The accompanying drawings illustrate preferred embodiments of the invention, as well as other information pertinent to the disclosure, in which.

DETAILED DESCRIPTION

This description of the exemplary embodiments is intended to be read in connection with the accompanying drawings, which are to be considered part of the entire written description. In the description, terms concerning coupling and the like, such as "connected" and "interconnected," refer to a relationship wherein structures communicate to one another either directly or indirectly through intervening structures unless expressly described otherwise.

A first embodiment of a method and circuit for providing a reference voltage using a bandgap reference circuit is described herein in connection with FIGS. 2-5. In this embodiment, the reference voltage is held by a capacitor or pair of capacitors and the bandgap circuit is turned off intermittently, providing a significant electrical current savings. The power source for the bandgap circuit can be VH or a high efficiency charge pump that provides a sufficient voltage less than VH.

Figure 1:
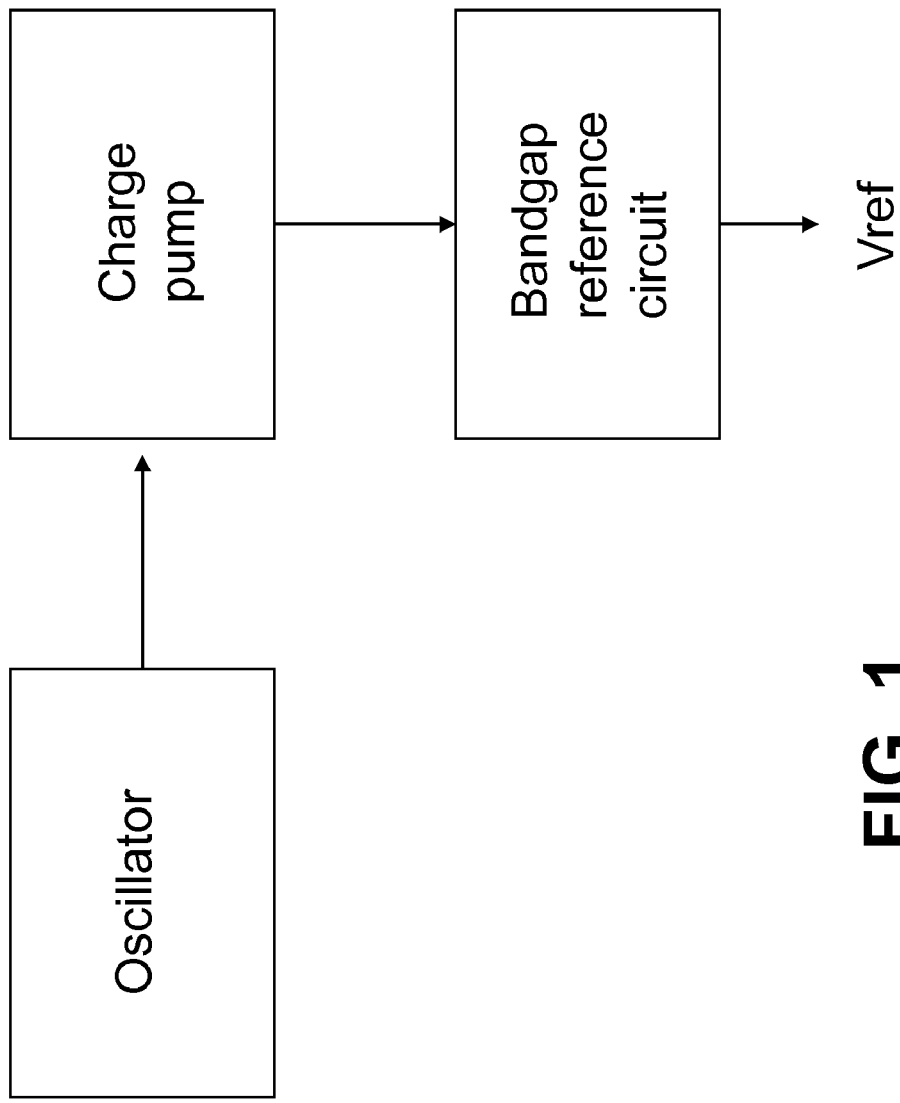
FIG. 1 is a block diagram of a prior art reference voltage generation circuit.
Figure 2:
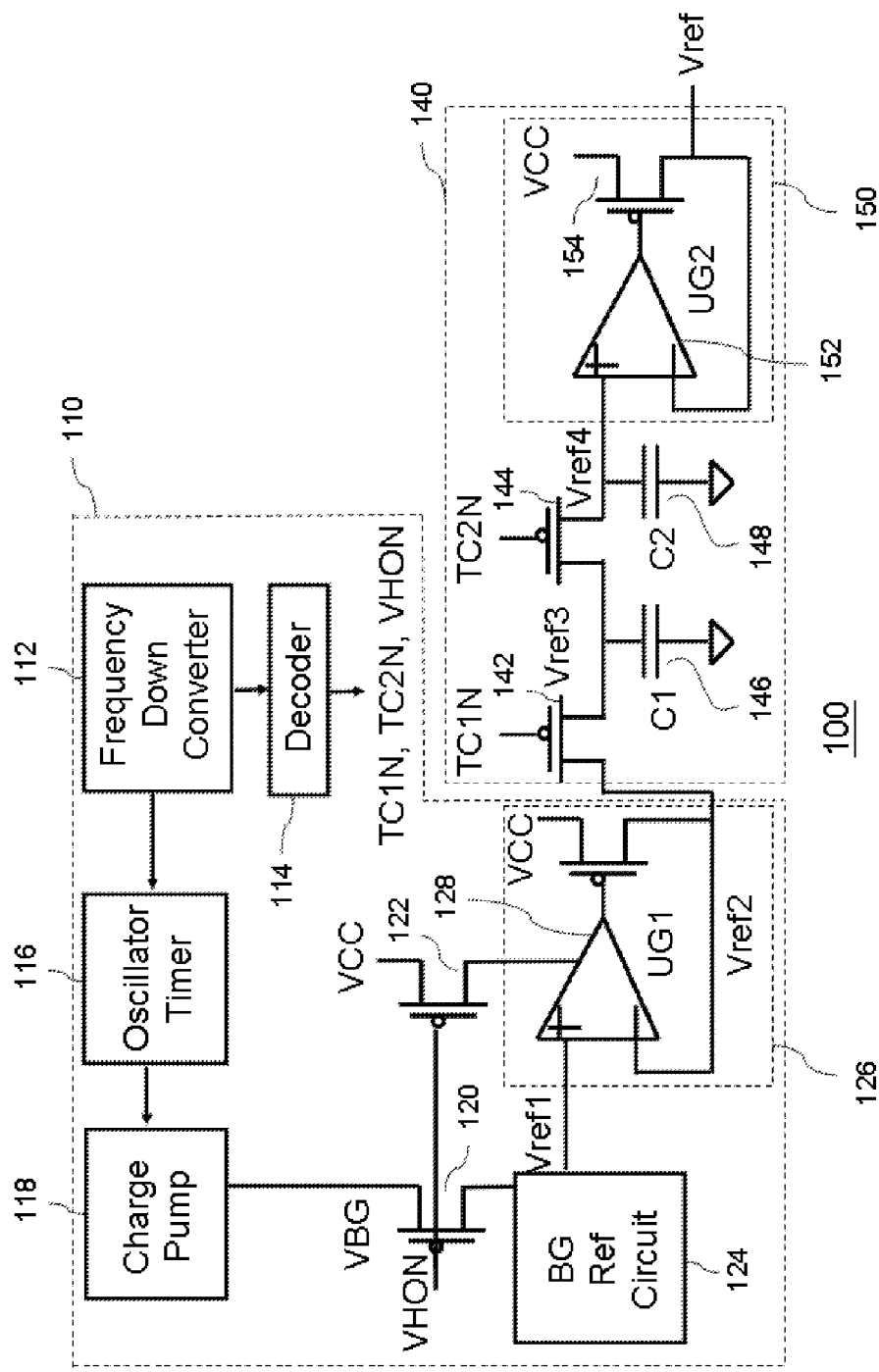
FIG. 2 is a block diagram of an embodiment of an intermittently activated bandgap reference circuit.
Figure 3:
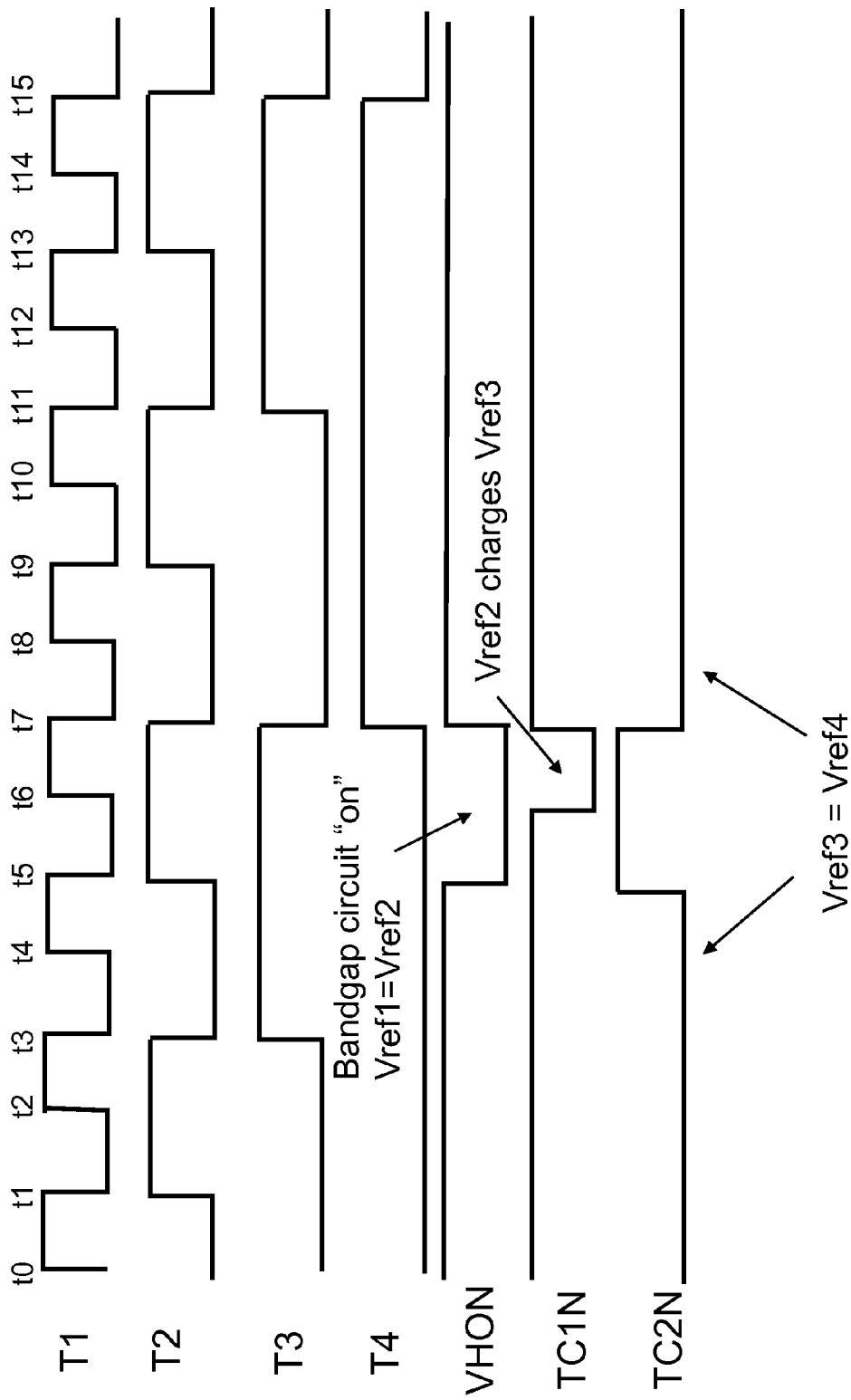
FIG. 3 is a timing diagram for control signals used in the bandgap reference circuit of FIG. 2.

FIG. 2 is a circuit diagram of a first embodiment of an intermittent activation bandgap reference circuit 100. FIG. 3 is timing diagram illustrating the timing of control signals for the circuit 100 of FIG. 2. The circuit of FIG. 2 has two stages, including a first stage 110 which is operated intermittently to provide a bandgap reference voltage Vref2 and a second stage 140 that operates to provide the output reference voltage Vref from the bandgap reference voltage Vref2.

The first stage 110 includes a control circuit for providing various control signals used in the circuit 100. In embodiments, the control circuit includes an oscillator timer 116 that provides a timer output T1 for timing the self refresh period of a memory circuit (e.g., DRAM circuit) in which the circuit 100 is used, a frequency down converter 112 that generates other signals (e.g., T2, T4, T8, etc.) having different periods based on the oscillator timer signal T1, and a decoder 114 to provide various control signals used by first and second stage 110, 140 of the circuit, i.e., TC1N, TC2N and VHON.

The oscillator timer 116 is also coupled to charge pump 118, which provides supply voltage VBG to bandgap reference circuit 124 through a switch, which is shown as PMOS transistor 120 in the illustrated embodiment. Alternatively, a higher power supply word line voltage VH (not shown) may be used, in which case no charge pump is needed. The bandgap reference circuit 124 can have any conventional design. The bandgap reference circuit 124 provides a first reference voltage (Vref1) to a first unity gain buffer 126, which includes operational amplifier 128 and PMOS transistor 130. The on/off state of the operational amplifier is controlled via a switch, which is shown as PMOS transistor 122. The unit gain buffer 126 (also known as a voltage follower) provides a second reference voltage (Vref2) that tracks the first reference voltage Vref1 from the bandgap reference circuit 124. Through operation of transistors 120 and 122, the bandgap reference circuit 124 and unity gain buffer 126 are only "on" when control signal VHON is at logic low. When VHON is at logic high, these two circuits are turned "off" to save power.

The second stage 140 is coupled to the output of the unity gain buffer 126 (i.e., to Vref2) and provides output reference voltage Vref of the voltage reference circuit 100. The second stage 140 includes two pass gate switches, shown as PMOS transistors 142, 144, two capacitors 146, 148, labeled as capacitors C1, C2 and output unity gain buffer 150, which includes operational amplifier 152 and PMOS transistor 154.

The operation of this circuit 100 is described below in connection with the timing diagram of FIG. 3.

FIG. 3 shows four clock signals, including clock signal T1 provided by oscillator timer 116 and three clock signals T2, T3 an T4 that may be derived from clock signal T1 by frequency down converter 112. These clock signals can be used by decoder 114 in a manner familiar to those of ordinary skill in this art to provide control signals VHON, TC1N and TC2N.

Initially, at time t0, VHON is high and remains logic high through time t5. With VHON high, switches 120 and 122 are open. The bandgap reference circuit 124 and the unity gain buffer 126 are not operational. During this time period, TC1N is also logic high, which opens switch 142, disconnecting the Vref3 node from the Vref2 node. TC2N is logic low, which closes switch 144, connecting the Vref3 node to the Vref4 node. Under these conditions, Vref3 is set to Vref4 through charge sharing between capacitors C1 and C2. Vref is set to Vref4 by unity gain buffer 150. This unity gain buffer 150, which is always on, can be designed with a low response time so as to sink only a few microamperes, which saves on total power consumption.

At time t5, VHON goes logic low, TC1N remains logic high and TC2N goes logic high. With TC2N at logic high, switch TC2N open, which disconnects the Vref4 node from the Vref3 node. Vref still tracks Vref4 through operation of the unity gain buffer 150. With VHON at logic low, switches 120 and 122 close and bandgap reference circuit 124 is activated and provides Vref1. Unity gain buffer 126 is also activated and operates to set Vref2 to Vref1. The output of the PMOS transistor 130 is used to supply Vref2. When Vref2 is smaller than Vref1, the output of the operational amplifier 128 will go low and the PMOS 130 is turned on stronger to drive Vref2. When Vref2 is larger than Vref1, the output of the operational amplifier 128 will go higher, which drives the PMOS transistor 130 more weakly. At the balance condition Vref1 equals Vref2. With switches 142, 144 open, voltage Vref4, and thus also voltage Vref, begin to decay as capacitors C2 discharges.

At time t6, TC1N goes from logic high to logic low. This turns on switch 142, connecting capacitor C1 to Vref2, which is now ready. Vref2 charges capacitor C2 until Vref3 equals the level of Vref2. TC2N is still high, meaning switch 144 is open. The voltage level of Vref continues to decay as capacitor C2 discharges.

At time t7, VHON and TC1N go logic high, and TC2N goes logic low. With VHON at logic high, switches 120 and 122 open and bandgap reference circuit 124 and unity gain buffer 126 turn off. With TC1N high, switch 142 is open, which disconnects capacitor C1 from the unity gain buffer 126. With TC2N low, switch 144 closes and connects capacitor C1 to capacitor C2. The charge stored in capacitor C1 is shared with capacitor C2 until Vref4 equals the level of Vref3. Of course, Vref tracks the level of Vref4 through the continuous operation of the unity gain buffer 150. These conditions are maintained until the next time that VHON goes low (i.e., time t5).

It is desired that Vref be as close to Vref1 as possible. Capacitor C1 shares charge with capacitor C2. Therefore, capacitor C1 must be larger than capacitor C2 to keep Vref very close to Vref1.

In general, under continuous operation, the bandgap reference circuit 124 will sink 20 μA if powered from VH or 80 μA if powered from VDD assuming a charge pump pumping efficiency of 25%. Each pass gate PMOS transistor 142, 144 connected to the Vref3 and Vref4 nodes has a small junction leakage current conservatively of about 1 nA, though it may be smaller or larger depending on the transistor size. As noted above, Vref3 is charged up by Vref2. When PMOS pass gate 142 is closed, the Vref2 node will share charge with the Vref3 node. The Vref2 node will initially experience a small drop and the Vref3 node will experience a little rise. The final voltage level is lower than Vref1. The unity gain buffer 126 will work to charge up Vref2 and Vref3 back to equal Vref1. A 0.01V drop between Vref1 and Vref (or even a 0.02V drop) is assumed acceptable, and thus Vref3 will need to be pulled up 0.01V when connected to the unity gain buffer 126. The PMOS 130 of the unity gain buffer 126 will drive the electrical current to charge up Vref2 and Vref3. A 1 μA charge up current can be assumed for purposes of calculating the VHON, TC1N and TC2N active periods as described below in more detail.

Assume C1 is 10 pF and C2 is 0.5 pF, and that Vref3 and Vref4 will be periodically recharged after each acceptable 0.01V loss (i.e., from when TC2N is low). If Vref1 is 1.25V and needs to charge up Vref3 0.01V by 1 μA, using the formula C×V=I×t, it takes 0.1 μs (i.e., CV/I=10 pF×0.01V/1 μA). The time it takes for Vref3 and Vref4 to drop 0.01V is 100 μs (i.e., 10.5 pF×0.01V/1 nA). Under these conditions, the ideal on/off duration of the bandgap reference circuit 124 is 0.1 μs/100 μs, i.e., 0.001. That is, the bandgap reference circuit 124 should be on (logic low state) for 0.1 μs and off (logic high state) for 100 μs. The current consumed is only 0.08 μA, i.e., 80 μA×0.001, assuming it is powered from VH. The current would be only 0.02 μA if powered from VDD.

Per the foregoing, it should be apparent that the control signals are timed to maintain the fourth reference voltage above a minimum reference voltage threshold value (e.g., to allow no more than a 0.01V decay in Vref) while maintaining the bandgap reference circuit in a low power off state for a greater period of time, and most preferably for a substantially greater period of time, than in higher power on state. Exemplary designs can significantly reduce power consumptions with "off" periods that are substantially greater than the "on" periods, for example 500 or more times greater and more preferably 1000 or more times greater.

Figure 4:
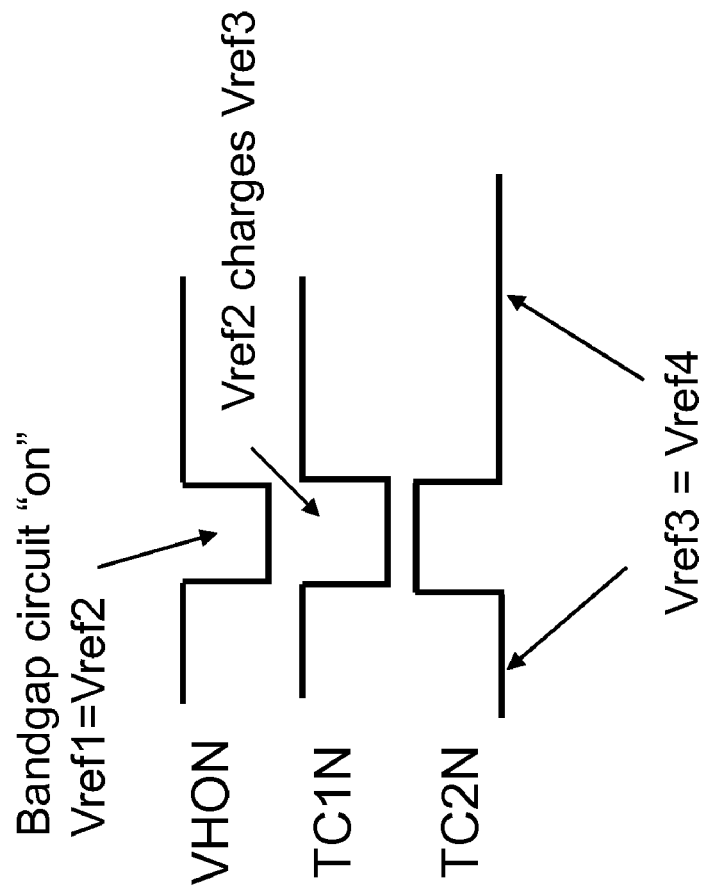
FIG. 4 illustrates an alternative timing diagram for the bandgap reference circuit of FIG. 2.

An alternative timing control approach for the circuit 100 of FIG. 2 is shown in FIG. 4. In this embodiment, Vref2 begins charging Vref3 as soon as the bandgap reference circuit 124 is turned on by VHON, making Vref2 equal to Vref2 and Vref2 equal to Vref3 by the end of the VHON period. When TC2N is eventually switched to logic low again, Vref3 will pull up Vref4 through charge sharing between capacitor C1 and capacitor C2. In practice, the bandgap circuit 124 needs about 1 μs to setup Vref1. If VHON is on (logic low) for about 1 μs, TC1N can be on (logic low) for the same period. TC2N is off (logic high) for the 1 μs period during which VHON and TC1N are on. Under these conditions, the average sink current from the bandgap reference circuit 124 would be 1/128×80 μA, which is less than 1 μA, assuming the bandgap circuit 124 is powered from VH. The built in assumption here is that the oscillator output T1 has a 1 μs period. The frequency down converter will generate signals with periods of 2 μs, 4 μs, etc. The period of 128 μs can be used for recharge purposes, or a longer period (e.g., 256 μs as long as it keeps Vref from dropping more than a desired amount, e.g., 0.01V. The unity gain buffer 126 is a fast response buffer and thus consumes more current than, for example, the unity gain buffer 150. There are significant savings by turning the buffer 126 off with the bandgap reference circuit 124. The unity gain buffer 126 can be assumed to sink 10 μA/128 or less than 0.1 μA. Under these conditions, the current sunk by the unity gain buffer 150, which is always on, is about 2 μA. The total sink current for the circuit under these operating conditions is less than 3.1 μA.

Figure 5:
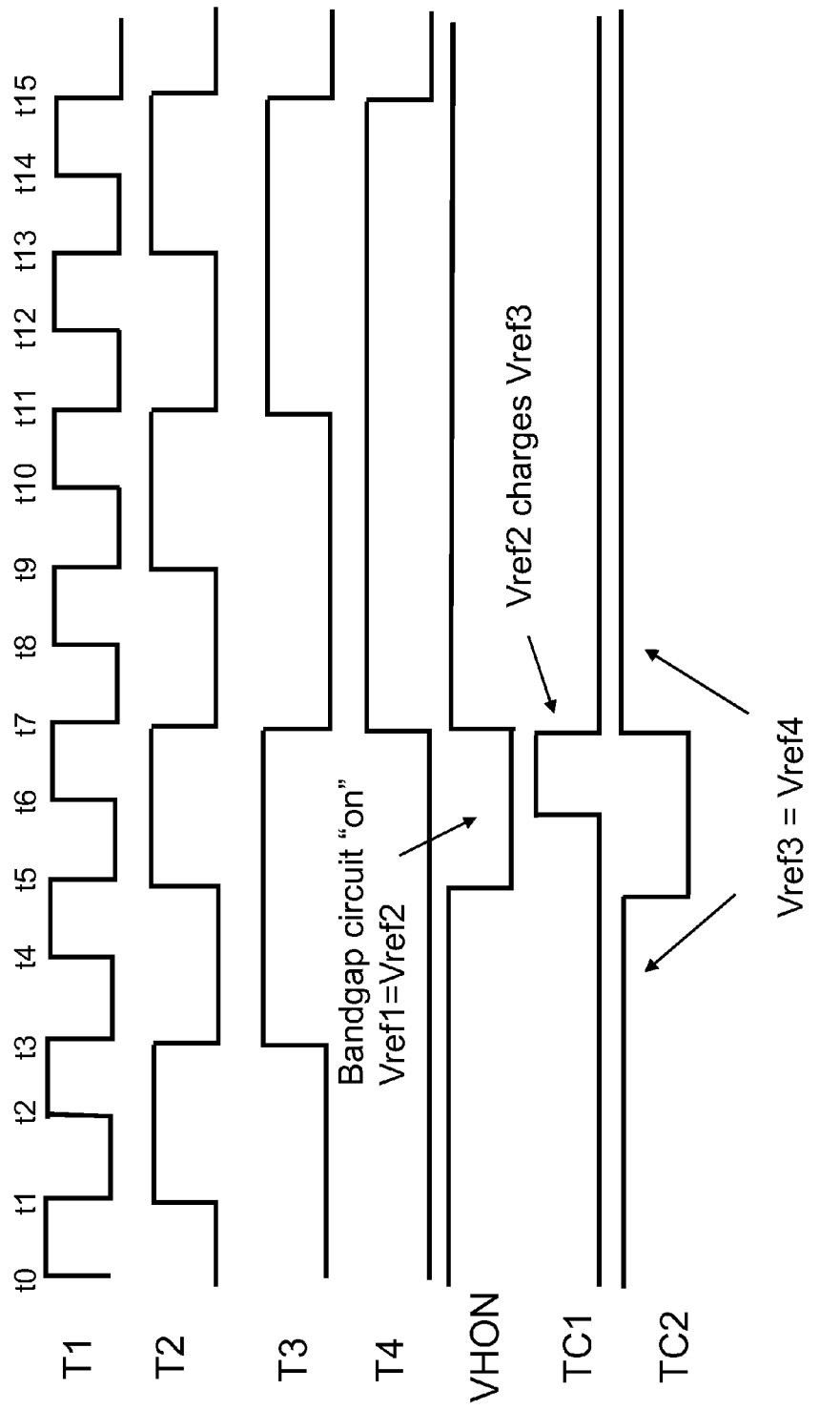
FIG. 5 is a timing diagram for an alternative embodiment of the bandgap reference circuit of FIG. 2 that uses NMOS pass gate transistors.

In an alternative embodiment, NMOS transistors can replace the PMOS pass gates 142, 144. In this embodiment, the signals TC1 and TC2 have opposite logic states from what is shown in FIG. 3. The timing diagram for this embodiment is shown in FIG. 5. This embodiment takes advantage of the lower leakage current characteristics of NMOS transistors, providing further power savings.

FIGS. 6-9 illustrate an alternative embodiment of an intermittently activated bandgap reference circuit 200. In this approach, two reference voltages VrefA and VrefB are generated, with VrefA being higher than VrefB but designed to drop faster than VrefB. These reference voltages are compared and used to generate the timing control signals for the intermittently activated bandgap reference circuit 200.

Figure 6:
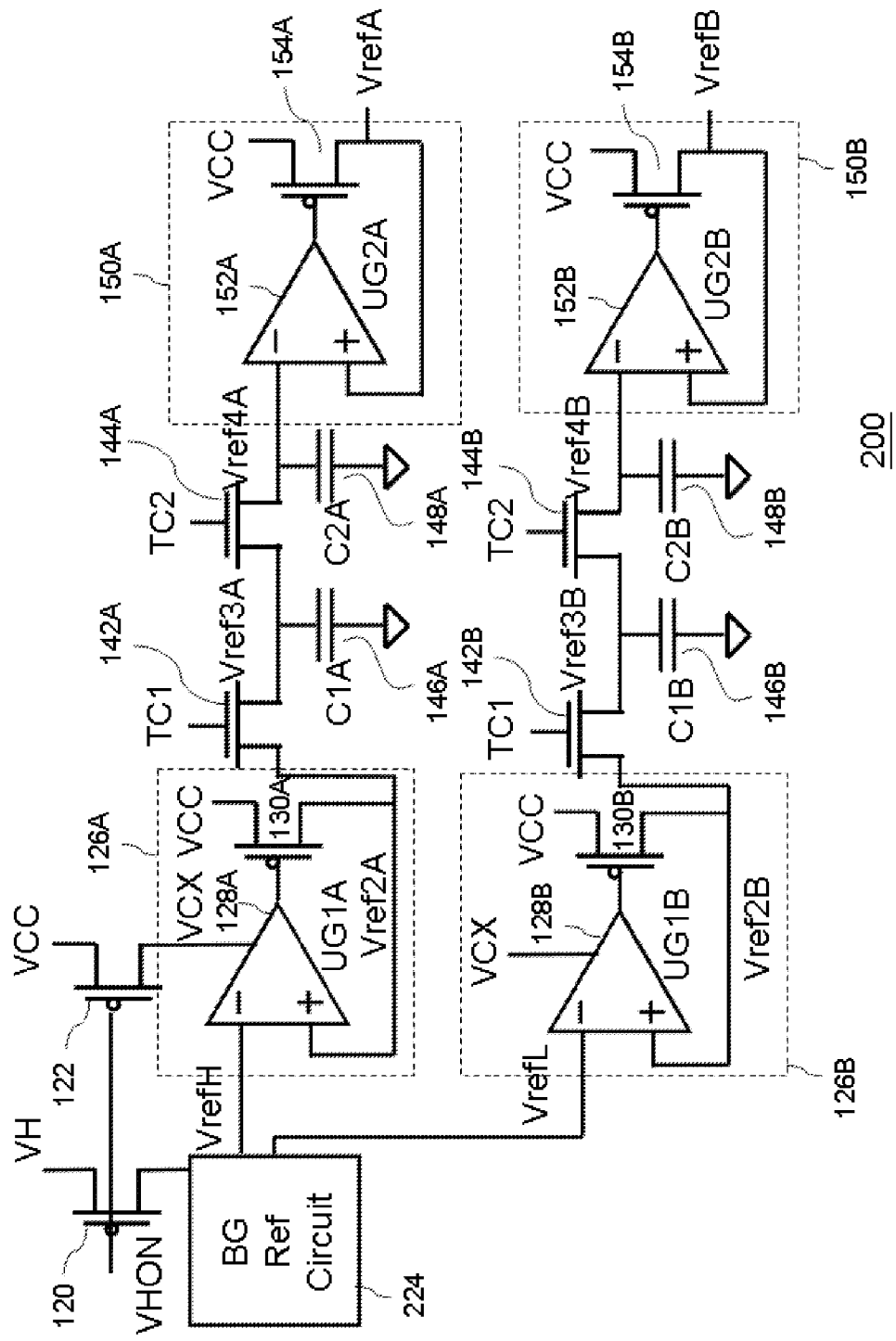
FIG. 6 illustrates another embodiment of an intermittently activated bandgap reference circuit.
Figure 7:
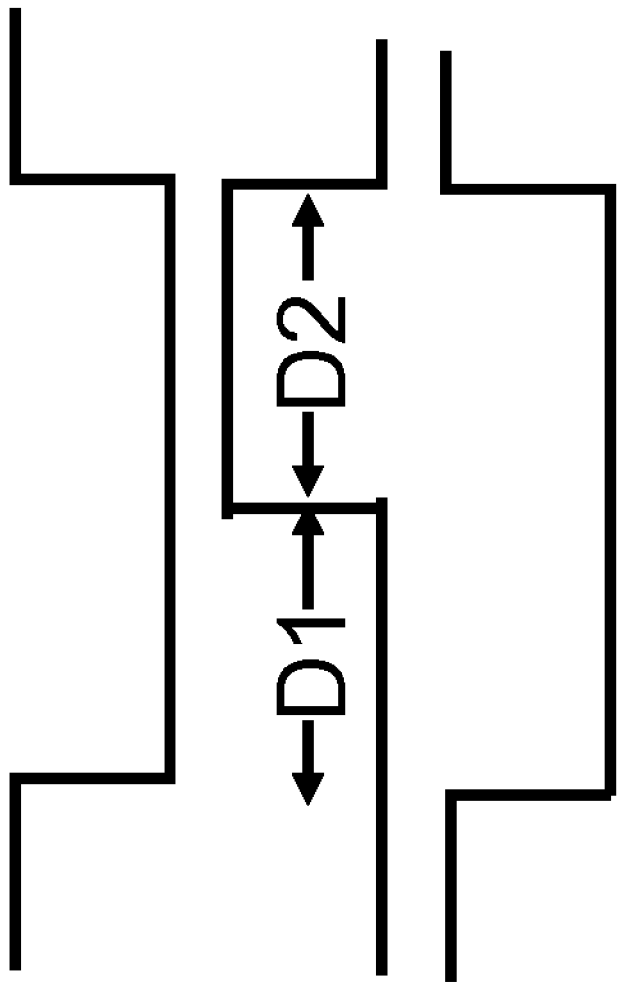
FIG. 7 is a timing diagram for control signals for the bandgap reference circuit of FIG. 6.

With specific reference to FIG. 6, the circuit 200 include a bandgap reference circuit 224 that is intermittently activated via control signal VHON via PMOS switch 120. The bandgap reference circuit is powered from supply voltage VH and configured in any manner familiar to those of ordinary skill in this art to provide a high reference voltage VrefH and a lower reference voltage VrefL. These two reference voltages are provided to two different circuit paths each configured similar to the paths described above in connection with FIG. 2 to generate a reference voltage, i.e., VrefA and VrefB, respectively. Specifically, in a first path, VrefH is provided to a fast response unity gain buffer 126A, which includes operational amplifier 128A and PMOS transistor 130A, and is designed to output Vref2A equal to VrefH. Like unity gain buffer 126 in FIG. 2, this unity gain buffer 126A is turned on/off responsive to VHON via PMOS switch 122. Vref2A is coupled to capacitor 146A (labeled C1A) through NMOS pass gate 142A, which is triggered by control signal TC1 to set Vref3A equal to Vref2A. Vref3A is coupled to capacitor 148A (labeled C2A) via NMOS pass gate 144A to charge share between capacitors 146A and 148A under control of signal TC2. The Vref4A node is coupled to unity gain buffer 150A, which includes operational amplifier 152A and PMOS transistor 154A, to set VrefA to the value of Vref4A. The response time of unity gain buffer 150A can be lower than that of unity gain buffer 126A to lower power consumption. FIG. 7 shows a timing diagram for the control signals VHON, TC1 and TC2. The circuit 200 operates generally in the manner described above in connection with FIG. 2 (albeit using NMOS pass gate transistors 142A, 144A) to generate VrefA.

The second path illustrated in FIG. 6 for generating VrefB is generally similar to the first path with some notable differences. In the second path, the low reference voltage VrefL is provided to a fast response unity gain buffer 126B, which includes an operational amplifier 128B and a PMOS transistor 130B for providing Vref2B equal to VrefL. The rest of the circuit path is similar to the first circuit path and includes pass gate transistors 142B and 144B, capacitors 146B and 148B, and unity gain buffer 150B, which includes operational amplifier 152B and PMOS transistor 154B. Vref3B is set to Vref2B under control of signal TC1. Vref4B is set to Vref3B via charge sharing under control of signal 144B. And VrefB tracks Vref4B through operation of unity gain buffer 150B.

In one embodiment, the capacitors 146A, 148A of the first path are designed so that VrefA drops faster than VrefB. Via a circuit described below in connection with FIG. 8, when VrefA drops to a certain point then VHON is turned on to activate the bandgap reference circuit 224. After a delay D1, Vref2A and Vref2B are ready. During another delay period D2, TC1 is logic high, which closes pass gates 142A and 142B, charging Vref3A to Vref2A and Vref3B to Vref2B. After D2, TC2 goes logic high, turning on pass gates 144A and 144B. This, in turn, charges Vref4A to Vref3A via charge sharing between capacitors 146A and 148A, and charges Vref4B to Vref3B via charge sharing between capacitors 146B and 148B. VrefA and VrefB track Vref4A and Vref4B, respectively, through operation of unity gain buffers 150A and 150B, respectively.

VrefA can be designed to drop faster than VrefB in various ways. In one embodiment, capacitors C1A and C1B have the same value and capacitors C2A and C2B have the same value but the connected NMOS pass gates 142A, 144A, have different leakages currents characteristics than pass gates 142B 144B. For example, NMOS 144A can be larger than NMOS 144B. Alternatively, the NMOS transistors 142A, 142B, and 144A, 144B can be the same size but the capacitance values in the two circuit paths could differ, i.e., C1A being smaller than C1B and C2A being smaller than C2B. Therefore, the higher voltage value—VrefA—will drop faster due to the larger leakage current or smaller capacitance in its circuit path.

Figure 8:
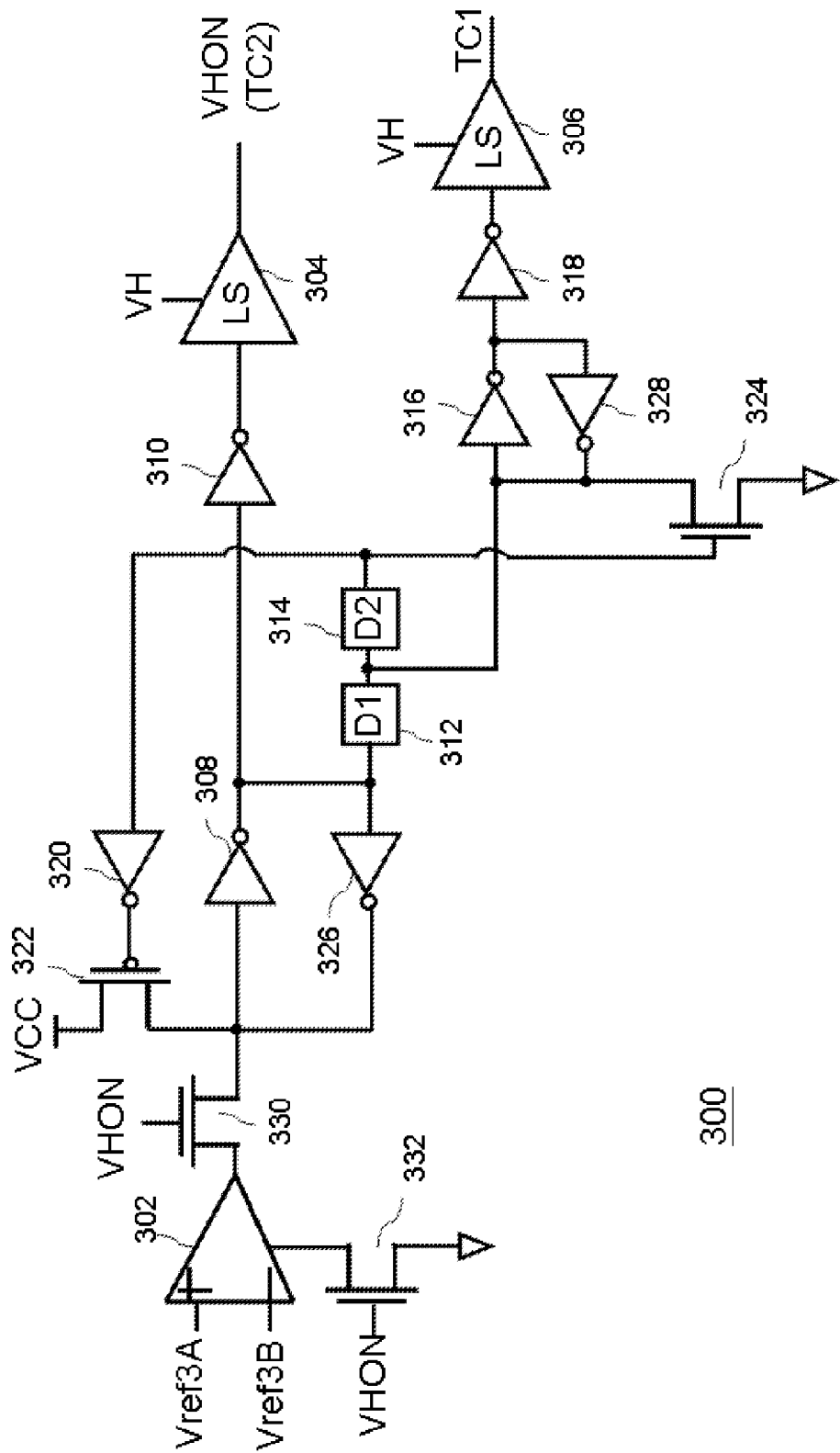
FIG. 8 illustrates an embodiment of a control circuit for providing the control signals of FIG. 7.

Assume the following conditions: C1A=2 pF; C2A=0.1 pF; C1B=10 pF; C2B=0.5 pF; VrefA=1.30V; VrefB=1.25V, and transistors TC1A, TC2A, TC3A and TC4A are all the same size and thus have the same leakage characteristics. Voltage VrefA will drop 10 times faster than voltage VrefB. If it is assumed that the leakage current is 1 nA, VrefA will drop to 1.25V from 1.30V in about 0.1 ms (i.e., 0.05V×2 pF/1 nA. Voltage VrefB, which is the output reference voltage of the circuit 200, drops an acceptable voltage of about 0.01V in this time window (i.e., 1 nA×0.1 ms/10 pF). There are two operational amplifiers that are always on, i.e, operational amplifier 152A and 152B, which consume about 5 μA FIG. 8 illustrates a circuit 300 for automatically generating the VHON, TC1 and TC2 control signals. Vref3A and Vref3B are compared using a comparison circuit 302, such as an operational amplifier or comparator. The circuit also includes a pair of level shifters 304, 306 which transform the input level of VCC to VH level. If Vref3A is higher than Vref3B, the output of the comparison circuit 302 is at high state. Under this condition, VHON is set to a logic high state via inverters 308, 310 and level shifter 304. TC2 is in phase with VHON. When the output of the comparison circuit 302 is high, the input signal to delay element 312 (labeled D1) is at logic low. The outputs of both delay element D1 and delay element 314 (labeled D2) are also at logic low. Under these conditions TC1 is at a logic low state via operation of inverters 316, 318 and level shifter 306.

When Vref3A drops to a level lower than Vref3B, the output of the comparison circuit 302 switches to a logic low state. This switches VHON to a logic low state. The input of delay element D1 becomes logic high and after a delay duration (D1), TC1 goes to logic high. After an additional delay duration (D2), the D2 output also goes to logic high. The output of delay element 314 is coupled to an inverter 320 which in turn is connected to the gate of the PMOS 322. The PMOS is turned on and pulls the output of the comparison circuit 302 to a logic high state. The PMOS 322 will fight with the output of the comparison circuit 302, but the PMOS 322 is designed to be stronger to pull the output to a high state. This pulls VHON to a logic high state again. The output of D2 is also connected to the gate of an NMOS transistor 324. NMOS transistor 324 turns on, pulling the input to inverter 316 low, which forces TC1 to a logic low state again.

Inverters 326 and 328 form latches with inverters 308 and 316, respectively. When VHON is at logic high (Vref3A greater than Vref3B), the operational amplifier 302 is turned on to do the comparison. When Vref3A is smaller than Vref3B, VHON will be at logic low and the operational amplifier is turned off by turning off NMOS 332. The NMOS 330 is also turned off. The latches (NMOS 308 and 326) are used to store the state of the operational amplifier 302. Inverter 328 is optional.

Figure 9:
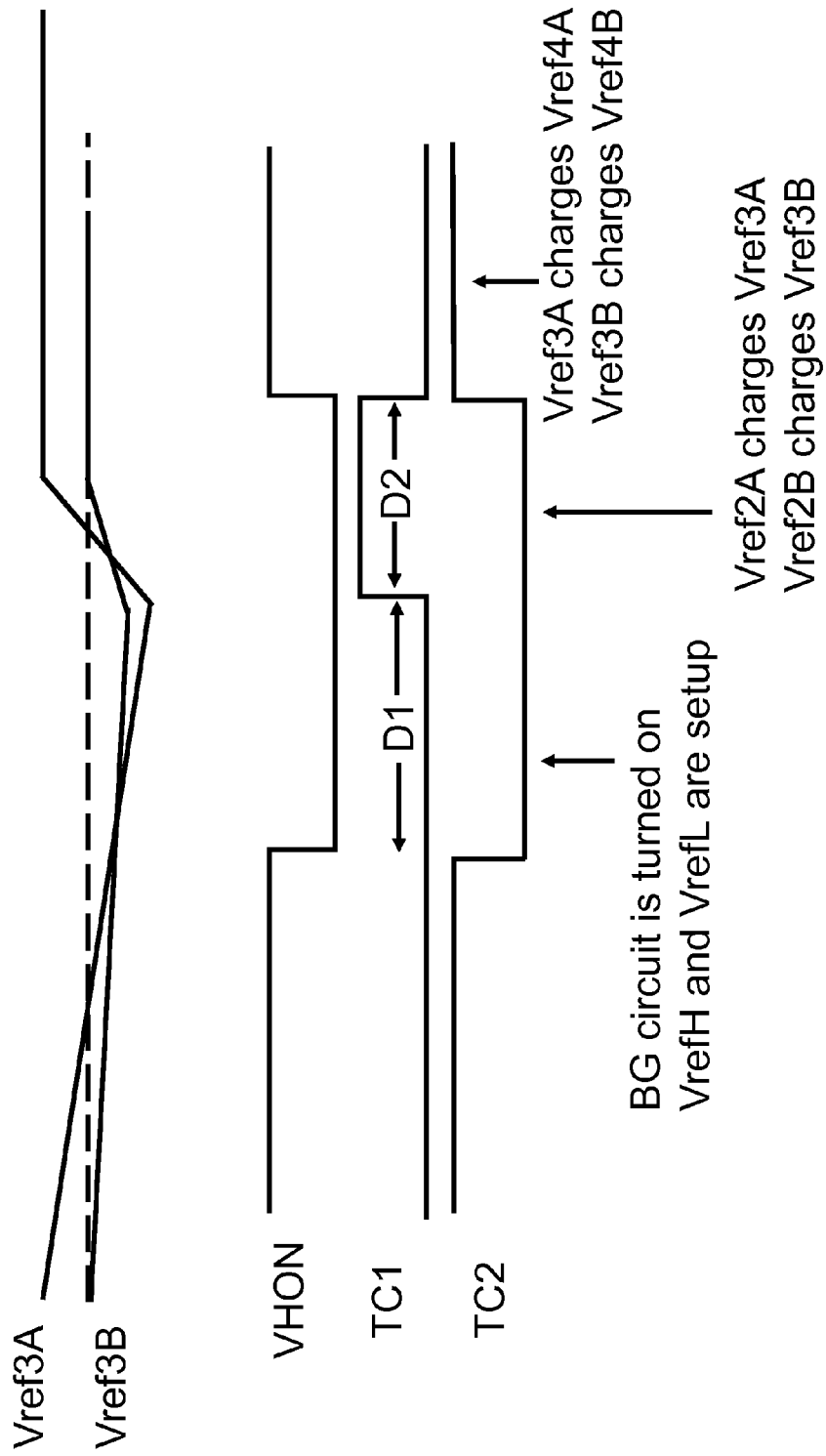
FIG. 9 is a timing diagram illustrating two reference voltages from the circuit of FIG. 6 with relation to control signals of FIG. 7.

FIG. 9 is a timing diagram further illustrating the operation of the circuit 200 of FIG. 6. Initially, VHON and TC2 are logic high and TC1 is logic low. As such, transistors 144A and 144B are on, setting Vref3A to Vref4A and Vref3B to Vref4B. Vref3A and Vref3B begin to decay. During D1, even with both TC1 and TC2 switches open, Vref3A and Vref3B continue to decay as shown in FIG. 9 through NMOS junction leakage, which exists even with the transistors turned off. When Vref3A drops below Vref3B, VHON goes low. This turns the bandgap reference circuit 224 on to setup VrefH and VrefL. Switches 144A and 144B open. After a delay period D1, TC1 goes high. With TC1 high, transistors 142A and 142B turn on, connecting Vref3A to Vref2A and Vref3B to Vref2B. At this point Vref3A and Vref3B begin to recharge until Vref3A equals Vref2A and Vref3B equals Vref2B. After an additional delay D2, TC1 again goes low and VHON and TC2 go high. The bandgap reference circuit 224 turns off, and switches 144A and 144B turn on to charge Vref4A and Vref4B from Vref3A and Vref3B, respectively. The process will then repeat.

In the foregoing description, bandgap reference circuit 224 is described as providing two different reference voltages, specifically VrefL which is lower than VrefH. In an alternative embodiment, bandgap reference circuit 224 can provide a single reference voltage, i.e., VrefL is equal to VrefH. In this embodiment, the circuit paths can still be configured so that VrefB is lower than VrefA through differences in charge-sharing in the two circuit paths. More specifically, the ratio of C2A/C1A is lower than the ration of C2B/C1B.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention.

What is claimed is:
1. A circuit for providing a reference voltage, comprising:
  a bandgap reference circuit operable to provide a first reference voltage;
  a first unity gain buffer coupled to the bandgap reference circuit operable to provide a second reference voltage at a second reference voltage node from the first reference voltage;
  a first switch for passing the second reference voltage between the second reference voltage node and a third reference voltage node;
  a first capacitor coupled to the third reference voltage node;

a second switch coupled between the third reference voltage node and a fourth reference voltage node;

a second capacitor coupled to the fourth reference voltage node, wherein during operation a fourth reference voltage at the fourth reference voltage node decays when the second capacitor discharges; and a control circuit operable to provide control signals to intermittently activate the bandgap reference circuit, first unity gain buffer and first switch to charge the first capacitor, to disconnect the third and fourth reference voltage nodes during charging of the first capacitor and to connect the third and fourth reference voltage nodes following charging of the first capacitor, thereby increasing the fourth reference voltage following decay thereof.

2. The circuit of claim 1, further comprising a second unity gain buffer coupled to the fourth reference voltage node to provide an output reference voltage.

3. The circuit of claim 2, wherein the first unity gain buffer has a faster response than the second unity gain buffer.

4. The circuit of claim 1, wherein the control circuit comprises an oscillator, a frequency converter and decoder.

5. The circuit of claim 1, wherein the first capacitor is larger than the second capacitor.

6. The circuit of claim 1, further comprising a first power supply node for supplying power to the bandgap reference circuit, a third switch disposed between the first power supply node and the bandgap reference circuit, a second power supply node for supplying power to the first unity gain buffer, and a fourth switch disposed between the second power supply node and the first unity gain buffer.

7. The circuit of claim 1,
wherein the control signals comprise a bandgap reference circuit control signal for activating the bandgap reference circuit and first unity gain buffer, a first switch control signal for activating the first switch, and a second switch control signal for activating the second switch,
wherein the bandgap reference circuit control signal and second switch control signal are configured such that the second switch is deactivated when the bandgap reference circuit and first unity gain buffer are activated and that the second switch is active when the bandgap reference circuit and first unity gain buffer are deactivated, and
wherein the first switch control signal is configured to activate the first switch after a delay from when bandgap reference circuit and first unity gain buffer are activated.

8. The circuit of claim 1,
wherein the control signals comprise a bandgap reference circuit control signal for activating the bandgap reference circuit, the first unity gain buffer, and a first switch control signal, and a second switch control signal for activating the second switch,
wherein the second switch control signal is configured such that the second switch is deactivated when the bandgap reference circuit, first unity gain buffer, and first switch are activated and then activated following after the bandgap reference circuit, first unity gain buffer and first switch are deactivated.

9. The circuit of claim 1, wherein the control signals are configured to maintain the fourth reference voltage above a minimum reference voltage threshold value while maintaining the bandgap reference circuit in a low power off state for a greater period of time than in higher power on state.

10. A circuit for providing a reference voltage, comprising:
a bandgap reference circuit operable to provide at least a first reference voltage;

first and second circuit paths coupled to the bandgap reference circuit for receiving the at least one first reference voltage, each circuit path comprising:
a first unity gain buffer coupled to the bandgap reference circuit operable to provide a second reference voltage at a second reference voltage node from the at least one first reference voltage;
a first switch for passing the second reference voltage between the second reference voltage node and a third reference voltage node;
a first capacitor coupled to the third reference voltage node;
a second switch coupled between the third reference voltage node and a fourth reference voltage node; and
a second capacitor coupled to the fourth reference voltage node, wherein during operation a fourth reference voltage at the fourth reference voltage node decays when the second capacitor discharges, wherein the first circuit path is configured so that the fourth reference voltage of the first circuit path decays faster than the fourth reference voltage of the second circuit path;
a control circuit operable to provide control signals dependent upon a comparison of reference voltages from the first and second circuit paths to intermittently activate the bandgap reference circuit, the first unity gain buffers, and first switches to charge the first capacitors, to disconnect the third and fourth reference voltage nodes of each circuit path during charging of the first capacitors and to connect the third and fourth reference voltage nodes of each circuit path following charging of the first capacitors, thereby increasing the fourth reference voltages following decay thereof,
wherein after increasing the fourth reference voltages, the fourth reference voltage of the first circuit path is higher than the fourth reference voltage of the second circuit path.

11. The circuit of claim 10, wherein each circuit path further comprises a second unity gain buffer coupled to the fourth reference voltage node to provide a respective output reference voltage.

12. The circuit of claim 11, wherein the first unity gain buffer of each circuit path has a faster response than the respective second unity gain buffer of that circuit path.

13. The circuit of claim 10, wherein the control signals are configured to maintain the fourth reference voltage of the second circuit path above a minimum reference voltage threshold value while maintaining the bandgap reference circuit in a low power off state for a greater period of time than in a higher power on state.

14. The circuit of claim 10, wherein the at least a first reference voltage provided by the bandgap reference circuit comprises a first circuit path first reference voltage and a second circuit path first reference voltage, wherein the first circuit path first reference voltage is higher than the second circuit path first reference voltage.

15. The circuit of claim 10, wherein the first capacitor of each circuit path is larger than the second capacitor of that circuit path.

16. The circuit of claim 10, further comprising a first power supply node for supplying power to the bandgap reference circuit, a third disposed between the first power supply node and the bandgap reference circuit, a second power supply node for supplying power to the first unity gain buffers, and a fourth switch disposed between the second power supply node and the first unity gain buffers.

17. The circuit of claim 10, wherein the control signals comprises a bandgap reference circuit control signal for activating the bandgap reference circuit and first unity gain buffers, a first switch control signal for activating the first switches, and a second switch control signal for activating the second switches.

18. The circuit of claim 17,
   wherein the bandgap reference circuit control signal and second switch control signal are configured such that the second switch is deactivated when the bandgap reference circuit and first unity gain buffers are activated and that the second switch is active when the bandgap reference circuit and first unity gain buffers are deactivated, and
   wherein the first switch control signal is configured to activate the first switch after a delay from when bandgap reference circuit and first unity gain buffers are activated.

19. The circuit of claim 10, wherein the at least a first reference voltage provided by the bandgap reference circuit is a single first reference voltage coupled to the first and second circuit paths.

20. The circuit of claim 19,
   wherein the first capacitor of each circuit path is larger than the second capacitor of that circuit path, and
   wherein a ratio in the first circuit path of the second capacitor to the first capacitor is lower than the ratio in the second circuit path of the second capacitor to the first capacitor.

\* \* \* \* \*